(12) United States Patent
Heertjes et al.

(10) Patent No.: US 8,135,488 B2
(45) Date of Patent: Mar. 13, 2012

(54) CONTROLLER FOR A POSITIONING DEVICE, METHOD FOR CONTROLLING A POSITIONING DEVICE, POSITIONING DEVICE, AND LITHOGRAPHIC APPARATUS PROVIDED WITH A POSITIONING DEVICE

(75) Inventors: Marcel François Heertjes, Best (NL); Wilhelmus Franciscus Johannes Simons, Beesel (NL); Dennis Andreas Petrus Hubertina Houben, Rothem (NL); Jeffrey Hendrikus Peter Maria Goossens, Stein (NL)

(73) Assignee: ASML Netherlands B.V., Veldhoven (NL)

( * ) Notice: Subject to any disclaimer, the term of this patent is extended or adjusted under 35 U.S.C. 154(b) by 585 days.

(21) Appl. No.: 12/331,829

(22) Filed: Dec. 10, 2008

(65) Prior Publication Data
US 2009/0244767 A1    Oct. 1, 2009

Related U.S. Application Data

(60) Provisional application No. 61/008,146, filed on Dec. 19, 2007.

(51) Int. Cl.
*G06F 19/00* (2011.01)
(52) U.S. Cl. .................... 700/121; 250/492.1
(58) Field of Classification Search ............... 700/121, 700/245, 114, 45, 29; 360/77.02; 250/492.1; 355/64; 318/560, 561, 632
See application file for complete search history.

(56) References Cited

U.S. PATENT DOCUMENTS

| | | | |
|---|---|---|---|
| 6,668,075 B1* | 12/2003 | Nakamura et al. | 382/144 |
| 6,833,974 B2* | 12/2004 | Koso et al. | 360/78.05 |
| 6,922,304 B2* | 7/2005 | Nakagawa | 360/77.08 |
| 7,818,073 B2 | 10/2010 | Heertjes | |
| 2002/0145722 A1* | 10/2002 | Compter et al. | 355/75 |
| 2002/0147520 A1* | 10/2002 | Mos et al. | 700/125 |
| 2004/0080863 A1* | 4/2004 | Nakagawa | 360/78.08 |
| 2005/0043834 A1* | 2/2005 | Rotariu et al. | 700/95 |
| 2005/0267609 A1* | 12/2005 | Van Donkelaar et al. | 700/45 |
| 2006/0139598 A1* | 6/2006 | Van Dijsseldonk et al. | 355/67 |
| 2007/0236163 A1 | 10/2007 | Heertjes et al. | |

FOREIGN PATENT DOCUMENTS
JP     2007-294958 A    11/2007

OTHER PUBLICATIONS
Office Action in related Japanese application No. 2008-320578 mailed Aug. 23, 2011.

* cited by examiner

*Primary Examiner* — Kidest Bahta
(74) *Attorney, Agent, or Firm* — Pillsbury Winthrop Shaw Pittman LLP (57) ABSTRACT

A controller for a positioning device is constructed and arranged to receive a position signal indicative of a position of the positioning device, compare the position signal to a setpoint signal indicative of a desired position of the positioning device to obtain an error signal, selectively modify the error signal based on the amplitude and the frequency content of the error signal to obtain a modified error signal, generate a control signal for controlling the positioning device on the basis of the modified error signal. The controller may be applied to control a positioning device in a lithographic apparatus.

13 Claims, 7 Drawing Sheets

CONTROLLER FOR A POSITIONING DEVICE, METHOD FOR CONTROLLING A POSITIONING DEVICE, POSITIONING DEVICE, AND LITHOGRAPHIC APPARATUS PROVIDED WITH A POSITIONING DEVICE

CROSS-REFERENCE TO RELATED APPLICATIONS

This application claims priority and benefit under 35 U.S.C. §119(e) to U.S. Provisional Patent Application No. 61/008,146, entitled "Controller for a Positioning Device, Method for Controlling a Positioning Device, Positioning Device, and Lithographic Apparatus Provided with a Positioning Device", filed on Dec. 19, 2007. The content of that application is incorporated herein in its entirety by reference.

FIELD

The present invention relates to a controller for a positioning device, a method for controlling a positioning device, a positioning device, and a lithographic apparatus provided with a positioning device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus includes various moving parts that are positioned using at least one positioning device such as a linear or rotating motor or actuator. In a lithographic apparatus, examples of moving parts are a substrate (e.g. wafer) stage, a patterning device (e.g. reticle) stage, a handler (robot arm), etc. A substrate stage may include different positioning devices for moving a wafer support in multiple degrees of freedom to desired positions with a desired speed, acceleration, etc. Likewise, a patterning device stage may include different positioning devices for moving a reticle support in multiple degrees of freedom to desired positions with a desired speed, acceleration, etc.

The process of positioning the substrate support or patterning device support using the positioning device is controlled by a controller. Such a controller may e.g. include a control characteristic being any combination of a proportional (P) control function, an integrating (I) control function, and a differentiating (D) control function.

In order to control the positioning device, the controller receives a position signal from a position sensor detecting the position of the object to be positioned (e.g. the wafer support or the reticle support). The position signal is compared with a setpoint signal defining the desired position of the object. The difference between the position signal and the setpoint signal is obtained as one or more error signals, and on the basis of the one or more error signals, the controller may generate one or more positioning device control signals for controlling the position and movement of the positioning device such as to reduce or eliminate position errors. This method of control is also referred to as feedback control, since the actual position is fed back to a controller input to generate the one or more error signals.

In the process of generating positioning device control signals, the controller shows a control characteristic, which is a feature of the controller. The control characteristic is the way in which the controller operates in response to detecting position errors.

Modeling or designing this control characteristic is often a trade off between disturbance suppression (which can, under linear feedback, e.g. be improved by increasing the integrator control function gain) and sensitivity to noise or a trade off between obtaining a small rising time and a small (or acceptable) overshoot thereby affecting the settle time. As an example, reference can be made to a specific velocity profile (or trajectory) that is encountered during the operation of a lithographic apparatus. In order to perform a scanning exposure process of a wafer or substrate, the following cycle may be performed for each die. In a first procedure, a substrate table, provided with a wafer (or substrate) is accelerated to a predefined velocity. Once this velocity is reached, this velocity needs to be maintained to perform the scanning exposure process. Once the scanning exposure is done, a deceleration phase is, in general, desired. This process is repeated for each die to expose the entire wafer.

Generally, in order to adequately handle time-varying disturbances, in a certain time period, a controller with a specific control characteristic related to the disturbance spectrum in this time period is desired. In another time period this spectrum may change, and therefore a different control characteristic may be desired.

As disclosed in US 2007/0236163, it has been proposed to provide a variable gain controller depending on the type of disturbance experienced. In the controller as described, is it proposed to, for error signals having a magnitude in a predefined range, selectively set the controller gain to a value higher than a value for error signals having a magnitude outside the range.

However, this may result in an amplification of noise which may be present in the error signal.

SUMMARY

It is desirable to provide a variable gain controller that is less sensitive to noise amplification.

According to an embodiment of the present invention, there is provided a controller for a positioning device, the controller being arranged to receive a position signal indicative of a position of the positioning device, compare the position signal to a set-point signal indicative of a desired position of the positioning device to obtain an error signal, selectively modify the error signal based on both the amplitude and the frequency content of the error signal to obtain a modified error signal, generate a control signal to control the positioning device on the basis of the modified error signal.

According to an other embodiment of the present invention, there is provided a method for controlling a positioning device, the method including receiving a position signal indicative of a position of the positioning device, comparing the position signal to a set-point signal indicative of a desired position of the positioning device to obtain an error signal, selectively modifying the error signal based on both the amplitude and the frequency content of the error signal to obtain a modified error signal, generating a control signal to control the positioning device on the basis of the modified error signal.

According to yet another embodiment, there is provided a positioning device for positioning an object including a first part and a second part, the first part movable relative to a second part, the second part being arranged to receive the object, a position sensor configured to generate a position signal indicative of a position of the object, a controller arranged to receive a position signal indicative of a position of the object, compare the position signal to a set-point signal indicative of a desired position of the object to obtain an error signal, selectively modify the error signal based on both the amplitude and the frequency content of the error signal to obtain a modified error signal, generate a control signal to control the positioning device on the basis of the modified error signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
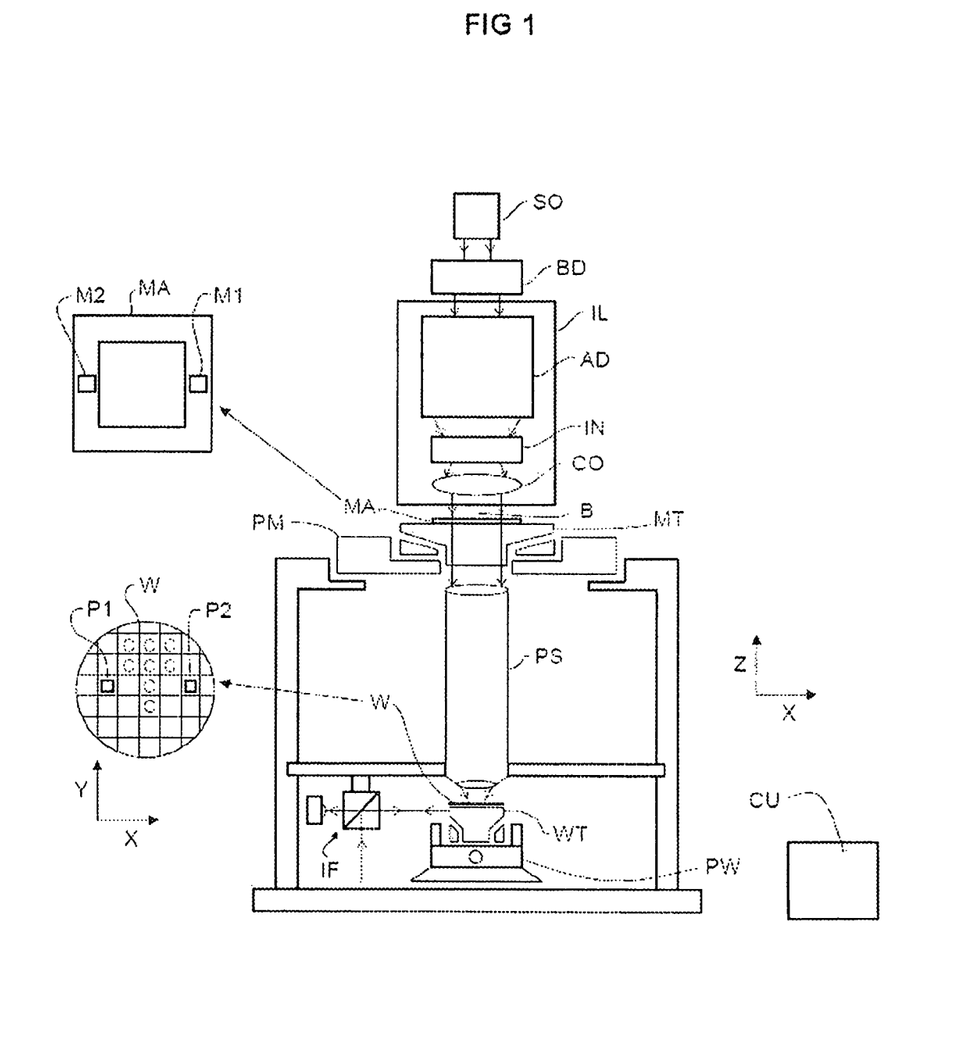
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM including at least one stator and mover, configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW including at least one stator and mover, configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure supports holds the patterning device in a manner that depends on the orientation of the patterning device, the design of the lithographic apparatus, and other conditions, such as for example whether or not the patterning device is held in a vacuum environment. The patterning device support or support structure can use mechanical, vacuum, electrostatic or other clamping techniques to hold the patterning device. The patterning device support or support structure may be a frame or a table, for example, which may be fixed or movable as required. The patterning device support or support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g. mask) MA, which is held on the patterning device support or support structure (e.g. mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW, a position sensor IF (e.g. an interferometric device, linear encoder or capacitive sensor), and a first controller the substrate table WT can be moved accurately, e.g. so as to position different target portions C in the path of the radiation beam B. Similarly, the first positioning device PM, another position sensor (which is not explicitly depicted in FIG. 1), and a second controller can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

1. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

2. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. According to an embodiment of the present invention, the lithographic apparatus as shown further includes a controller CU arranged to control at least one of the positioning devices present in the apparatus, e.g. at least one of the positioners PW or PM. The controller CU is arranged to receive a position signal indicative of a position of the positioning device, compare the position signal to a set-point signal indicative of a desired position of the positioning device to obtain an error signal, selectively modify the error signal based on both the amplitude and the frequency content of the error signal to obtain a modified error signal, and to generate a control signal for controlling the positioning device on the basis of the modified error signal. As an example, the controller may be arranged to perform a frequency based filtering of the error signal prior to a selective modification of the error signal, e.g. based on the amplitude of the error signal. By doing so, the effect of noise amplification, that could e.g. be caused by the selective modification of the error signal can be mitigated. In an embodiment, the controller includes a band pass filter to selectively modify the error signal. In an embodiment, the controller includes a non-linear filter to selectively modify the error signal. Further details and different embodiments of the present invention are described in the following figures.

Figure 2:
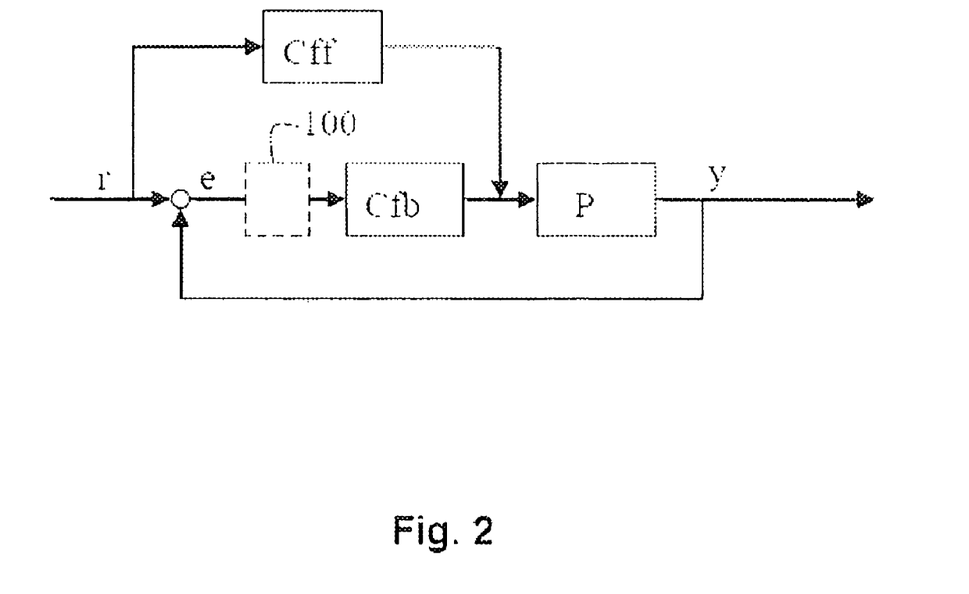
FIG. 2 depicts a block diagram of an embodiment of a controller according to an embodiment of the invention.

FIG. 2 schematically shows a general block-diagram of a nominal controlled motion system. From a reference command r, a servo error signal e is constructed using the relation e=r−y where y represents the output of the plant or system P. The error signal e is fed into a feedback controller Cfb that aims at disturbance rejection in view of set-point disturbances r and force disturbances f. In addition, FIG. 2 schematically shows a scheme 100 as applied in an embodiment of the present invention which is arranged to selectively provide an additional gain to the control loop. To obtain an improved tracking accuracy, a feedforward controller Cff may also be added.

Figure 3:
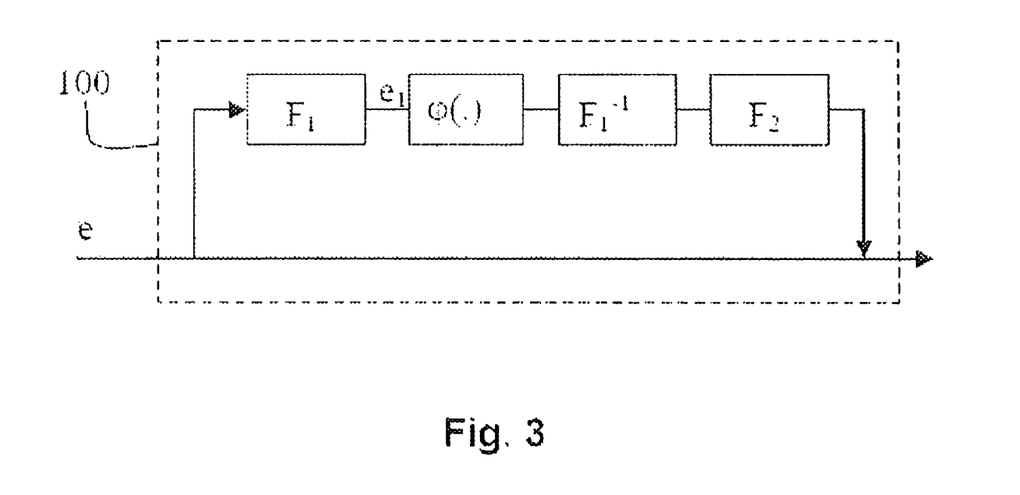
FIG. 3 depicts a block diagram of an embodiment of a part of the controller of FIG. 2.

In an embodiment of the present invention, a hybrid control design for motion systems is proposed that aims at an improved disturbance rejection. This is achieved by applying a variable gain control scheme 100 as illustrated in FIG. 3. This scheme 100 selectively provides an additional gain to the control loop. This is achieved in the following manner: In a first procedure (F1), a frequency based filtering of the error signal e is performed. In a next procedure, the filtered error signal is subjected to a nonlinear weighting φ(.). By doing so, an extra controller gain can be introduced or not, based on whether the filtered error signal is large enough or not.

Subsequently, a second frequency based filtering, which substantially corresponds to the inverse of the filtering function F1, i.e. F1$^{-1}$, is performed on the weighted error signal in order to maintain closed-loop stability. By doing so, a dynamic controller gain is introduced. This dynamic controller gain can be used to adapt a trade-off between disturbance rejection and measurement noise sensitivity. If the error signal e contains frequency contributions sufficiently below the controller bandwidth then servo performance could benefit from an increased controller gain. On the other hand, beyond the controller bandwidth an increased gain may induce the amplification of high-frequent noise. By monitoring the signals at hand and act accordingly, i.e. by applying a dynamic (nonlinear) controller gain as described above, one may significantly improve the servo performance. It should be noted that, compared to the control method as disclosed in US 2007/0236163, the proposed controller and control method enable to selectively apply a variable controller gain in a certain frequency domain or range rather than merely adjust the gain on the basis of the magnitude (or amplitude) of the error signal. The improved controller and control method enable to improve the low-frequency disturbance rejection properties of the controller without transmitting too much high-frequency noise. That is, on the occurrence of performance-limiting oscillations, the linear controller is given extra controller gain. Because of the incidental nature in which these oscillations are assumed to occur, the amplification of noise can be kept limited. A further benefit of the presented control method compared to the method described in US 2007/0236163 is that it enables an improved suppression of low-frequent signals that have an amplitude inside the threshold value of the non-linear weighting (as described in US 2007/0236163). Without the frequency based filtering, such suppression, which can result in a improved performance, would not occur. The control method can be referred to as a hybrid control method as it incorporates a nominal linear control design (i.e. the control schedule as shown in FIG. 2 excluding scheme 100) and an extra nonlinear controller (i.e. scheme 100 as described further in FIG. 3). The nominal design aims at both robust stability and performance. Hybrid control refers to the (continuous) switching between the dynamics corresponding to the nominal control design and the dynamics induced by the extra nonlinear controller. An embodiment of the resulting hybrid control design according to the present invention combines three functions: monitoring by lifting the frequency content of interest temporarily from the error signals at hand, selection by (nonlinear) weighting of the lifted error signals, and loop shaping to keep the closed-loop stability result valid. In the following paragraphs, the different procedures in the nonlinear strategy are explained in more detail.

In a first procedure, a monitoring function is given to a filter structure F1 which aims at temporary lifting the frequency content of low-frequent performance-limiting oscillations contained in the error signal e. In an embodiment, filter structure $F_1(s)$ may be a single notch filter operation of the form $$F_1(s) = \frac{s^2 + 2\beta_z\omega_z s + \omega_z^2}{s^2 + 2\beta_p\omega_p s + \omega_p^2} \qquad (1)$$

wherein $\beta_z > \beta_p$ representing the damping coefficients and $\omega_z = \omega_p$ the zero and pole frequencies. These frequencies can be associated with the frequency content of performance limiting oscillations. By doing so, a discrimination can be obtained between the observation of these oscillations (in the filtered error signal) or not.

In the second procedure, an amplitude-based modification is performed on the filtered error signal, which can be seen as a (weighted) selection between applying extra feedback or not. Such a selection can e.g. take the form of a deadzone non-linearity. As an example, the (filtered) error signal can be modified by subjecting it to an operation φ(.), given by:

$$\varphi(e_1) = \begin{cases} 0, & \text{if } |e_1| \le \delta \\ 1 - \dfrac{\delta}{|e_1|}, & \text{if } |e_1| > \delta \end{cases} \qquad (2)$$

Wherein δ is a deadzone length and $|e_1|$ represents the amplitude of the filtered error signal $e_1$. If performance-limiting oscillations are sufficiently present in the lifted error response, then extra controller gain is induced by the operation φ(.). Contrarily, if $e_1$ does not contain such oscillations, then no extra gain is induced thereby avoiding the extra amplification of noise by feedback.

In a third procedure, the filtering operating of the first procedure is, at least partly, inverted, e.g. by applying a filtering operating F1$^{-1}$ to the weighted error signal. By doing so, the stability of the closed loop system can be maintained.

Optionally, a loop shaping function F2 can be introduced to improve the closed loop stability. Such a loop shaping function F2 can e.g. take the form of $$F_2(s) = \alpha \cdot \frac{s^2 + 2\beta_z\omega_z s + \omega_z^2}{s^2 + 2\beta_p\omega_p s + \omega_p^2} \cdot \frac{\omega_{lp}^2}{s^2 + 2\beta_{lp}\omega_{lp}s + \omega_{lp}^2} \qquad (3)$$

wherein α a stability-limited extra gain ratio, $\omega_z = \omega_p$ the zero and pole breakpoints of a notch filter, $\beta_z > \beta_p$ the corresponding damping coefficients, $\omega_{lp}$ the breakpoint of a second-order low-pass filter and $\beta_{lp}$ its damping coefficient. As a result, the controller (or control method) as described provides the possibility to discriminate between performance-limiting oscillations and others on the basis of the frequency content of these oscillations. As such, a strictly performance-based filter operation can be obtained that effectively deals with such oscillations. As an example, the results of the hybrid control method can be demonstrated on a substrate stage of a substrate scanner. A schematic representation of a wafer scanner is e.g. shown in FIG. 1.

Figure 4:
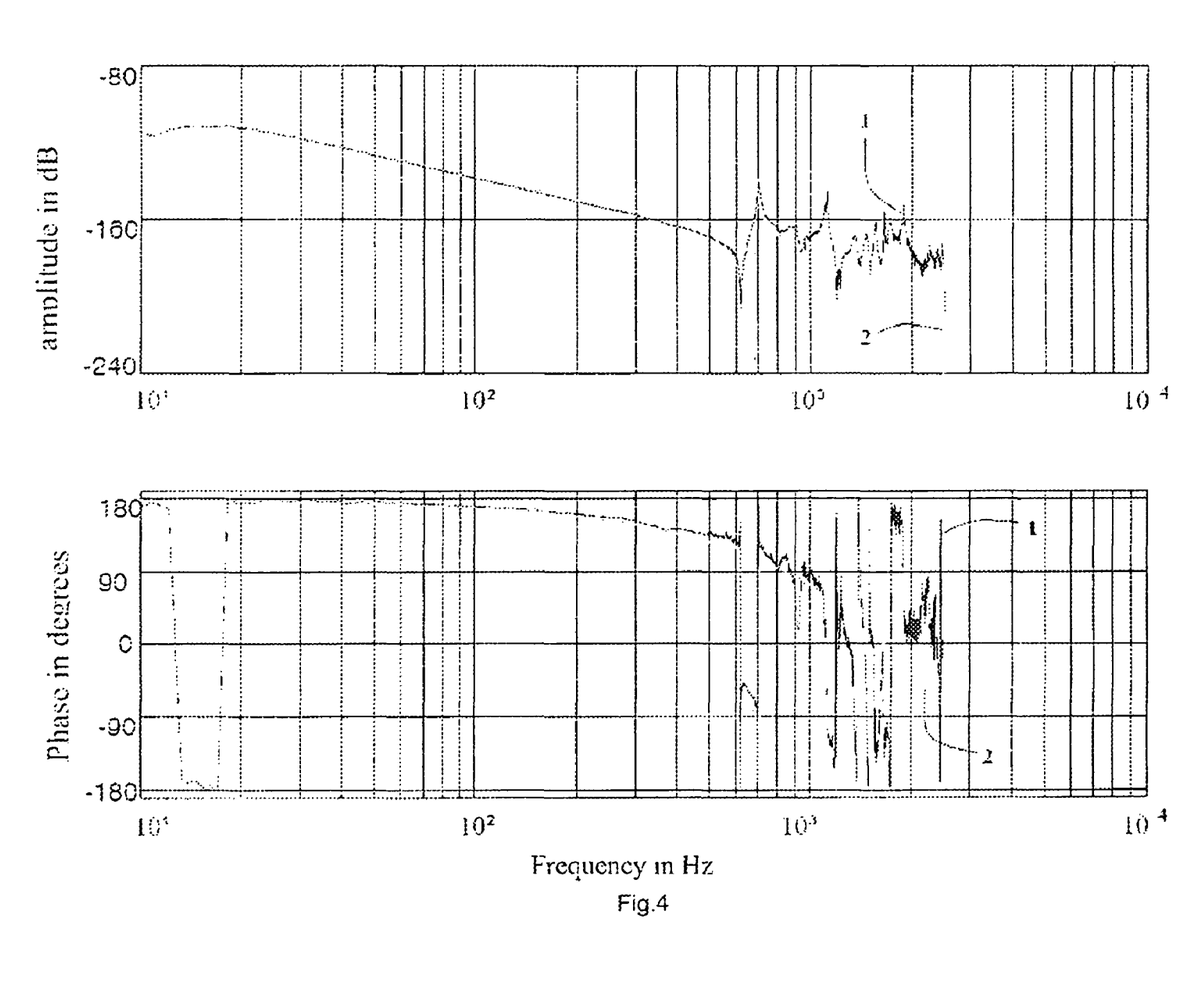
FIG. 4 depicts a Bode diagram of the measured mechanics in Z-direction along with the characteristics of a fourth order model.

In the apparatus as shown, both patterning device and substrate are part of two separate motion controlled subsystems: the patterning device stage positioner PM and the substrate stage positioner PW each, in general, employing a dual-stroke strategy. A long-stroke is used for fast large-range motions whereas a short-stroke is used for accurate but small-range tracking. The short-stroke stages may be represented by floating masses which are controlled in six degrees-of-freedom using e.g. electromagnetic actuators. For the z-direction of the short-stroke substrate stage, the single-input single-output linear feedback design can be represented by the simplified block diagram representation of FIG. 2. In transfer function notation, the substrate stage can be represented or approximated by a fourth-order model. The validity of this model can e.g. be seen from FIG. 4. FIG. 4 shows a Bode diagram of the measured mechanics in z-direction (1) along with the characteristics of a fourth-order model (2).

Figure 5:
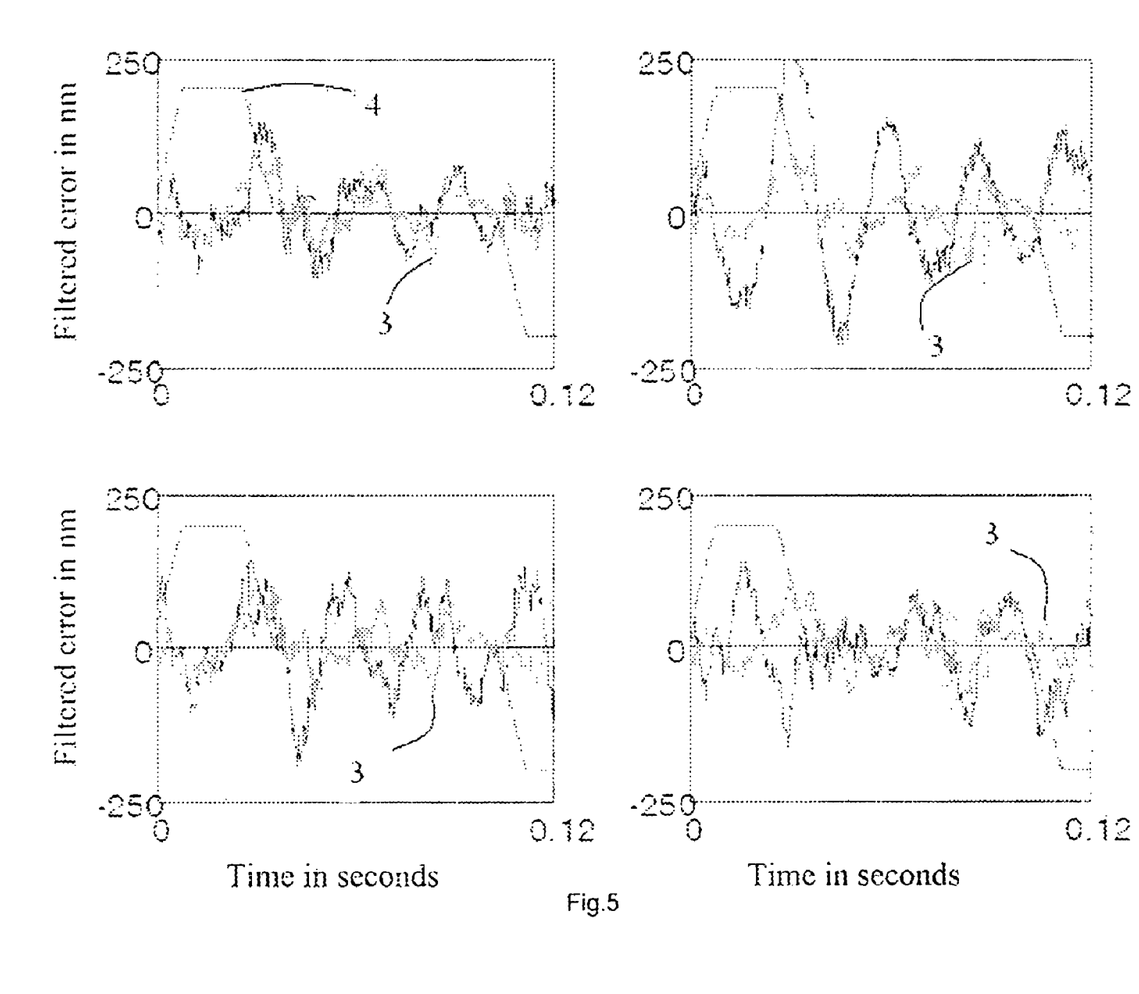
FIG. 5 depicts the time-series of the filtered error signal in Z-direction under equal scans at 5 different locations on the substrate.
Figure 6:
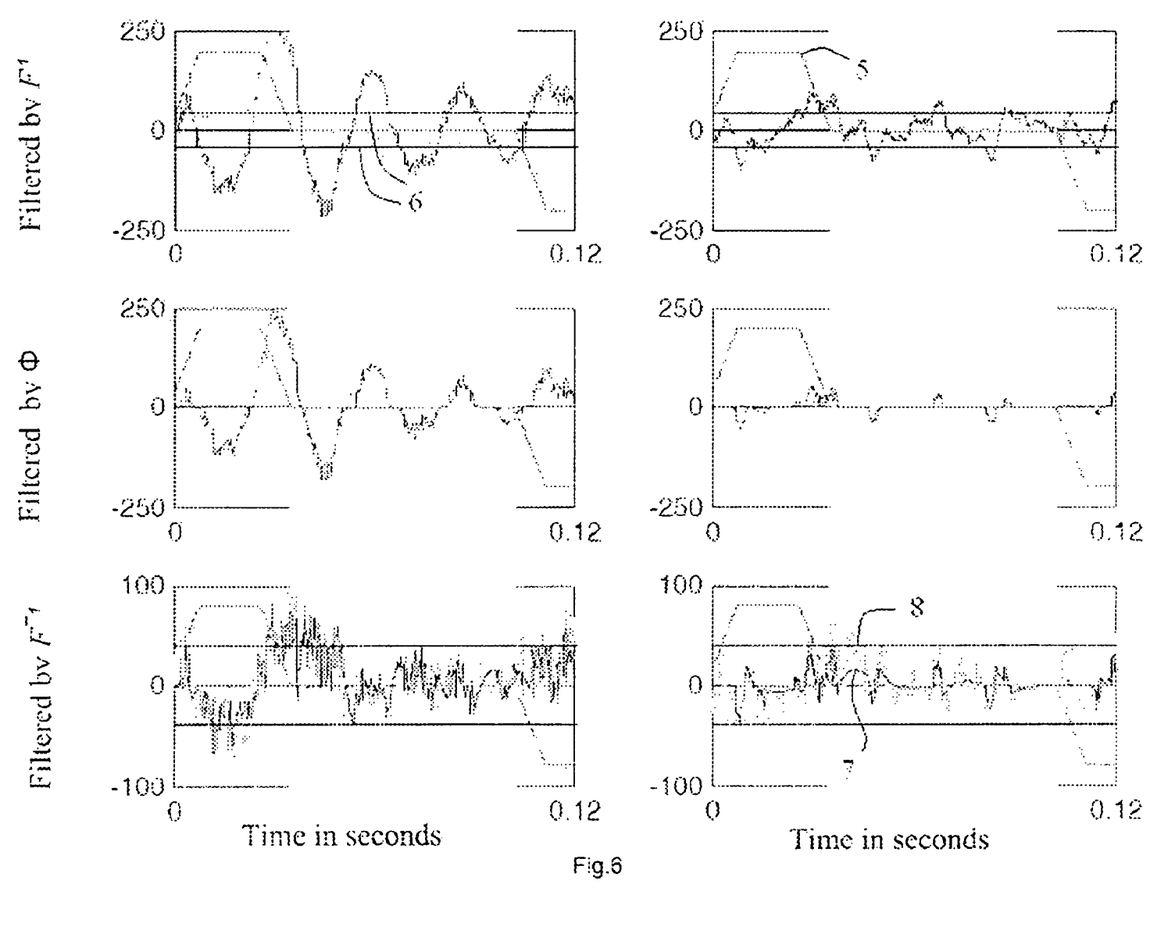
FIG. 6 depicts the time-series measurement of the closed-loop and non-linear filtered error signals at two locations on the substrate.

Given a linear control design, the closed-loop performance of the controller is assessed at five distinct positions on a substrate: at four wafer corner points $(x,y)=(-0.1,0.1)$, $(0.1, 0.1)$, $(-0.1,-0.1)$, $(0.1,-0.1)$ and at the wafer center $(x,y)=(0,0)$. At each position an identical scan is performed. FIG. 5 shows the filtered error signal in z-direction as a function of time under equal scans at the different locations on the substrate. Each of the four graphs of FIG. 5 shows the error signal at one of the corner locations together with the error signal at the center location, the latter being indicated by (3). The dotted line (4) schematically depicts the applied acceleration setpoint as a function of time. As can be seen, large deviations can be observed at the considered positions on the substrate. Especially for the indicated interval of constant velocity where wafer illumination takes place. This is the interval where performance should be achieved. It is clear that the controlled substrate stage shows position-dependent behavior. The error responses differ in terms of frequency, amplitude, and phase. This provides the main motivation for the application of a hybrid control strategy. The ability of the hybrid controller to achieve improved performance is shown in FIG. 6. Under linear closed-loop conditions (the extra nonlinear controller 100 in FIG. 3 is not yet activated) two scan positions are considered: $(x,y)=(0.1,0.1)$ and $(0,0)$. The upper part of FIG. 6 shows the result of the filter operation F1 applied to the error signal e along with a scaled representation of the acceleration setpoint (5). The user-defined value of the deadzone length $\delta=40$ nm is indicated by means of the dotted lines (6). At $(x,y)=(0,0)$ the error signal almost entirely falls within the indicated bounds, whereas at $(x,y)=(0.1,0.1)$, it significantly exceeds these bounds. The result of the nonlinear filter operation $\phi(.)$ as e.g. described in equation (2) is shown in the middle part of the figure. For $(x,y)=(0.1,0.1)$, it can be seen that the sinusoidal-based behavior largely remains unaffected whereas for $(x,y)=(0,0)$ almost all (random-based) oscillations are removed. As a result, the overall nonlinear filter operation gives a strong reduction of the original error signal e (graph (7) versus graph (8)) at $(x,y)=(0,0)$ whereas it roughly shows the same signal at $(x,y)=(0.1,0.1)$. At $(x,y)=(0.1,0.1)$, this provides the means to obtain improved disturbance suppression under high-gain feedback while at the same time it keeps the amplification of noise at $(x,y)=(0,0)$ limited.

In a lithographic illumination process, the performance of the process is, in general, assessed by a moving average filtering (MA) of the error signal and a moving standard deviation (MSD) filter operation on the error signal. MA and MSD can be used to assess the accuracy of the illumination process with respect to overlay and fading; Overlay is a measure for position accuracy, hence the ability to perform a new scan at a previous scan location. In terms of servo control measures, overlay is (partly) assessed by the moving average (MA) filter operation.

Figure 7:
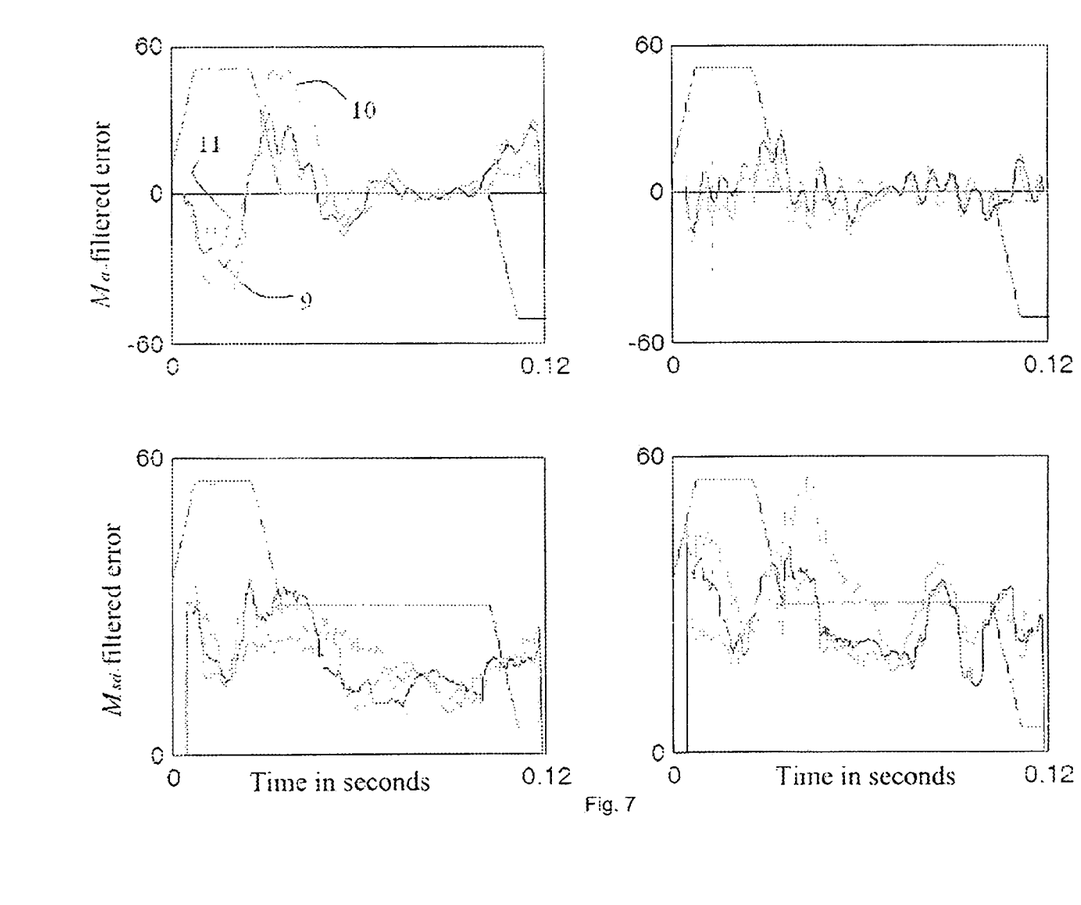
FIG. 7 depicts the time-series measurement of the MA and MSD filtered error signals at two locations on the substrate.
Figure 8:
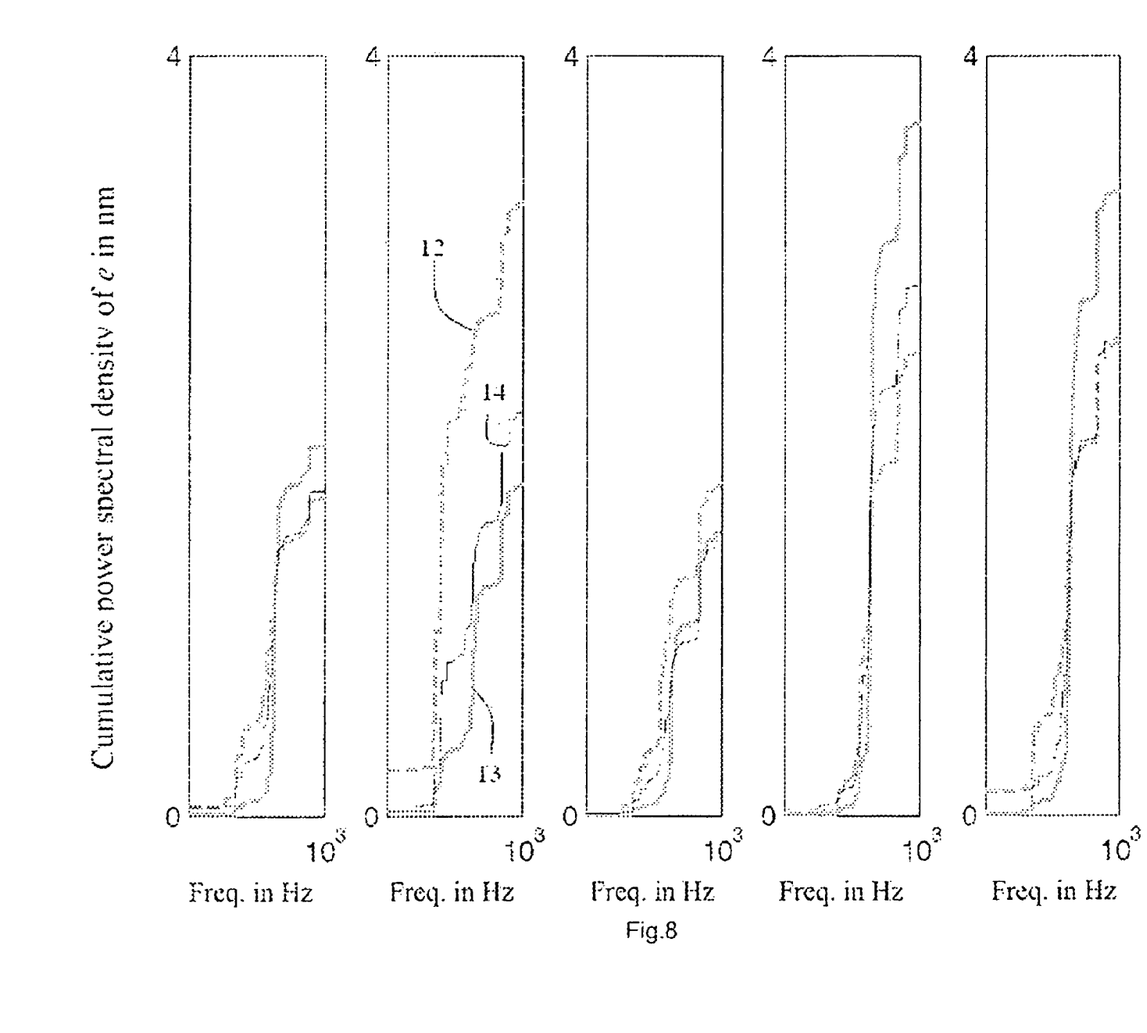
FIG. 8 depicts a cumulative power spectral density analysis of the measured servo error in Z-direction.

Fading relates to image quality, i.e. the ability to focus light in the path from the lens (or projection system) to the wafer. To assess the performance with respect to fading, the moving standard deviation (MSD) can be applied. For the previously considered substrate positions $(x,y)=(0.1,0.1)$ and $(x,y)=(0,0)$ the effect of the hybrid control design in achieving performance (expressed using the MA and MSD criteria) is shown in FIG. 7. FIG. 7 shows the time-series measurement of the MA and MSD filtered error signals (graph (9) at two positions $(x,y)=(0.1,0.1)$ and $(x,y)=(0,0)$, using the hybrid control method. Additionally, the results are shown for two linear design limits: a low-gain design with $\phi(.)=0$ (shown in grey-dashed line (10) in FIG. 7) and a high-gain design with $\phi(.)=1$ (shown in grey-solid line (11) in FIG. 7). In the indicated scanning interval, it can be seen in the upper-left part at $(x,y)=(0.1,0.1)$ that both the nonlinear design and the high-gain linear design perform equally good in terms of keeping the peak values of the moving averaged (MA) filtered error small. This shows improved low frequency disturbance rejection in comparison with the low-gain linear design. In the lower-right part, however, at $(x,y)=(0,0)$, it can be seen that both the nonlinear design and the low-gain linear design perform equally good. In fact, they perform better than the high-gain linear design. Hence an improved high-frequent noise response is obtained in comparison with the high-gain linear design. In terms of cumulative power spectral density analysis, FIG. 8 shows the results for the five considered wafer positions. A distinction is made between the linear low-gain (grey-dashed line 12), the linear high-gain (grey-solid line 13), and the nonlinear gain (black-solid line 14). It can be seen that the hybrid control design at each considered position tends to result in the smallest rms-value of the error signal.

Summarizing, for motion control systems, a hybrid control design is proposed which aims at improved disturbance rejection properties under equal noise response. Key to the design is the distinction between stability and performance. While nonlinear closed-loop stability is guaranteed in the presence of loop-shaping filters, performance is effectively dealt with by the introduction of a stability-invariant weighting filter connection. For a substrate stage of an industrial wafer scanner such a strategy improves upon performance in the presence of position-dependent behavior. Measured at distinct (and sufficiently distributed) positions along the substrate, the hybrid control design demonstrates improved low frequency disturbance rejection without the necessary transmission of high-frequent noise. Hence the kind of transmission inherently present in the high-gain linear controller limit.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

In the above, the present invention has been explained with reference to an embodiment of a lithographic apparatus. It should be clear to a person skilled in the art that the invention can be applied to different kind of apparatus including motor devices for positioning an object. Examples of such different kind of apparatus are magnetic or optical storage devices, electron microscope imaging stages, and magnetic levitation stages for laser cutting.

In the above, the present invention has been explained with reference to block diagrams, which illustrate functional blocks of the positioning device according to the present invention. It is to be understood that one or more of these functional blocks may be implemented in hardware, where the function of such functional block is performed by individual hardware components, but it is also possible that one or more of these functional blocks are implemented in software, so that the function of such functional block is performed by one or more sequences of machine-readable instructions, which may be executed on a computer system or programmable device such as a microprocessor, microcontroller, etc. to perform the controller function according to the invention. A data storage medium (e.g. semiconductor memory, magnetic or optical disk) may have such software stored therein, or such software may be provided through appropriate signals, either by wire or wireless.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically. Software, a program, a computer program, or a software application may include a subroutine, a function, a procedure, an object method, an object implementation, an executable application, an applet, a servlet, a source code, an object code, a shared library/dynamic load library and/or other sequence of instructions designed for execution on a computer system.

The descriptions above are intended to be illustrative, not limiting. Thus, it will be apparent to one skilled in the art that modifications may be made to the invention as described without departing from the scope of the claims set out below.

What is claimed is:

1. A controller for use in a positioning device, the controller constructed and arranged to:
    receive a position signal indicative of a position of the positioning device;
    compare the position signal to a set-point signal indicative of a desired position of the positioning device to obtain an error signal;
    selectively modify the error signal based on an amplitude and a frequency content of the error signal to obtain a modified error signal; and
    generate a control signal to control the positioning device based on the modified error signal, wherein the controller is constructed and arranged to, in order to selectively modify the error signal, (a) perform a first frequency based filtering of the error signal to obtain a filtered error signal; (b) perform an amplitude based modification of the filtered error signal; and (c) perform a second frequency based filtering substantially corresponding to an inverse of the first frequency based filtering.

2. A controller according to claim 1, wherein the controller comprises a band pass filter to selectively modify the error signal.

3. A controller according to claim 1, wherein the controller comprises a non-linear filter to selectively modify the error signal.

4. A controller according to claim 1, wherein the controller comprises a deadzone filter to selectively modify the error signal.

5. A controller for use in a positioning device, the controller constructed and arranged to:
    receive a position signal indicative of a position of the positioning device;
    compare the position signal to a set-point signal indicative of a desired position of the positioning device to obtain an error signal;
    selectively modify the error signal based on an amplitude and a frequency content of the error signal to obtain a modified error signal; and
    generate a control signal to control the positioning device based on the modified error signal, wherein the controller comprises a non-linear filter to selectively modify the error signal, and wherein the non-linear filter is configured to, for error signals having a magnitude in a predefined range, selectively set a gain to a value lower than a value for error signals having a magnitude outside the range.

6. A positioning device configured to position an object comprising:

a first part and a second part, the first part movable relative to the second part, the second part arranged to receive the object;

a position sensor configured to generate a position signal indicative of a position of the object; and a controller arranged to receive a position signal indicative of the position of the object, compare the position signal to a set-point signal indicative of a desired position of the object to obtain an error signal, selectively modify the error signal based on the amplitude and the frequency content of the error signal to obtain a modified error signal, and generate a control signal to control the positioning device based on the modified error signal, wherein the controller is arranged to, in order to selectively modify the error signal, (a) perform a first frequency based filtering of the error signal to obtain a filtered error signal, (b) perform an amplitude based modification of the filtered error signal, and (c) perform a second frequency based filtering substantially corresponding to an inverse of the first frequency based filtering.

7. A positioning device according to claim 6, wherein the controller comprises a band pass filter configured to selectively modify the error signal.

8. A positioning device according to claim 6, wherein the controller comprises a deadzone filter configured to selectively modify the error signal.

9. A positioning device according to claim 6, wherein the first part is a long stoke actuator and the second part is a short stroke actuator.

10. A lithographic apparatus comprising:

an illumination system configured to condition a radiation beam;

a patterning support constructed to support a patterning device, the patterning device being capable of imparting the radiation beam with a pattern in its cross-section to form a patterned radiation beam;

a substrate support constructed to hold a substrate;

a projection system configured to project the patterned radiation beam onto a target portion of the substrate; and a positioning device configured to position at least one of the supports, the positioning device comprising:

a first part and a second part, the first part movable relative to the second part, the second part arranged to receive the at least one of the supports;

a position sensor configured to generate a position signal indicative of a position of the at least one of the supports; and a controller arranged to receive a position signal indicative of the position of the at least one of the supports, compare the position signal to a set-point signal indicative of a desired position of the at least one of the supports to obtain an error signal, selectively modify the error signal based on the amplitude and the frequency content of the error signal to obtain a modified error signal, and generate a control signal to control the positioning device based on the modified error signal.

11. A lithographic apparatus according to claim 10, wherein the first part is a long stoke actuator and the second part is a short stroke actuator.

12. A method for controlling a positioning device, the method comprising:

receiving a position signal indicative of a position of the positioning device;

comparing the position signal to a set-point signal indicative of a desired position of the positioning device to obtain an error signal;

selectively modifying the error signal based on both the amplitude and the frequency content of the error signal to obtain a modified error signal; and generating a control signal for controlling the positioning device based on the modified error signal, wherein selectively modifying the error signal includes performing a first frequency based filtering of the error signal to obtain a filtered error signal;

performing an amplitude based modification of the filtered error signal; and performing a second frequency based filtering substantially corresponding to an inverse of the first frequency based filtering.

13. A non-transitory computer readable medium having machine executable instruction, the instructions being executable by a machine to perform a method of controlling a positioning device, the method comprising:

receiving a position signal indicative of a position of the positioning device;

comparing the position signal to a set-point signal indicative of a desired position of the positioning device to obtain an error signal;

selectively modifying the error signal based on both the amplitude and the frequency content of the error signal to obtain a modified error signal; and generating a control signal for controlling the positioning device based on the modified error signal, wherein selectively modifying the error signal includes performing a first frequency based filtering of the error signal to obtain a filtered error signal;

performing an amplitude based modification of the filtered error signal; and performing a second frequency based filtering substantially corresponding to an inverse of the first frequency based filtering.

* * * * *